United States Patent
Pal et al.

(10) Patent No.: US 11,966,674 B2
(45) Date of Patent: Apr. 23, 2024

(54) METHOD AND SYSTEM FOR DESIGNING ARTIFICIALLY STRUCTURED MATERIALS WITH CUSTOMIZED FUNCTIONALITIES

(71) Applicant: Tata Consultancy Services Limited, Mumbai (IN)

(72) Inventors: Parama Pal, Bangalore (IN); Prajith Pillai, Bangalore (IN); Rinu Chacko, Pune (IN); Deepak Shyamsunder Jain, Pune (IN); Beena Rai, Pune (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 578 days.

(21) Appl. No.: 17/219,204

(22) Filed: Mar. 31, 2021

(65) Prior Publication Data
US 2022/0180025 A1  Jun. 9, 2022

(30) Foreign Application Priority Data
Dec. 7, 2020 (IN) ............................. 202021053131

(51) Int. Cl.
*G06F 30/27* (2020.01)
*G06N 3/045* (2023.01)
*G06N 3/08* (2023.01)

(52) U.S. Cl.
CPC ............. *G06F 30/27* (2020.01); *G06N 3/045* (2023.01); *G06N 3/08* (2013.01)

(58) Field of Classification Search
CPC .......... G06F 30/27; G06N 3/045; G06N 3/08; G06N 3/044
See application file for complete search history.

(56) References Cited

FOREIGN PATENT DOCUMENTS

CN   111767678 A   10/2020

OTHER PUBLICATIONS

Yeung, C., Tsai, J. M., King, B., Pham, B., Ho, D., Liang, J., ... & Raman, A. P. (Aug. 2, 2020). Multiplexed Supercell Metasurface Design and Optimization with Tandem Residual Networks. arXiv preprint arXiv:2008.00587. (Year: 2020).*

(Continued)

*Primary Examiner* — Bijan Mapar
(74) *Attorney, Agent, or Firm* — FINNEGAN, HENDERSON, FARABOW, GARRETT & DUNNER LLP

(57) ABSTRACT

Artificially structured materials are created artificially and offer customizable properties. They are being used in various fields. A system and method for designing artificially structured materials have been provided. The system and method is based on neural networks for approximating the electromagnetic (EM) responses of the artificially structured materials. By treating the EM spectral data as time-varying sequences and the inverse problem as a single-input, multi-output model, the architecture is forced to learn the geometry of the designs from the training data as opposed to abstract features thereby addressing both the forward and the inverse design problems. The system is configured to provide end-to-end workflow from collating the requirement specifications from the user (based on the intended use case such as solar energy harvesting, biological sensing, thermosphotovoltaics, photo-detection, creation of imaging devices, absorption filtering and stealth technology) to generating a device design for the intended functionality.

13 Claims, 8 Drawing Sheets

(56) References Cited

OTHER PUBLICATIONS

Liu, D., Tan, Y., Khoram, E., & Yu, Z. (May 2019). Training Deep Neural Networks for the Inverse Design of Nanophotonic Structures. In 2019 Conference on Lasers and Electro-Optics (CLEO) (pp. 1-2). IEEE. (Year: 2019).*

Ma, W., Cheng, F., & Liu, Y. (2018). Deep-learning-enabled on-demand design of chiral metamaterials. ACS nano, 12(6), 6326-6334. (Year: 2018).*

Hou, Zheyu et al., "Prediction Network of Metamaterial with Split Ring Resonator Based on Deep Learning", Nanoscale Res Lett., Apr. 2020, NCBI https://nanoscalereslett.springeropen.com/track/pdf/10-1186/s11671-020-03319-8.pdf.

Hou, Zheyu et al., "Deep-Learning-Enabled On-Demand Design of Chiral Metamaterials", Nanoscale Res Lett., 2018, PUBMED, https://web.northeastern.edu/iiulab/publications/76_2018_ACS%20Nano_Deep-teaming-enabled%20on-demand%20desion%20of%20chiral%20metamaterials.pdf.

Nadell, Christian C. et al., "Deep learning for accelerated all-dielectric metasurface design", Research Article, Sep. 2019, vol. 27, Optics Express, https://www.osapublishing.org/DirectPDFAccess/C82FB996-C4C8-4814-A288C7FF6333AB90_418820/oe-27-20-27523.pdf?da=1&id=418820&seg=0&mobile=no.

Ma, Wei et al., "Probabilistic representation and inverse design of metamaterials based on a deep generative model with semi-supervised learning strategy", Optics, Jan. 2019, Arxiv, https://arxiv.org/ftp/arxiv/papers/1901/1901.10819.pdf.

* cited by examiner

METHOD AND SYSTEM FOR DESIGNING ARTIFICIALLY STRUCTURED MATERIALS WITH CUSTOMIZED FUNCTIONALITIES

PRIORITY CLAIM

This U.S. patent application claims priority under 35 U.S.C. § 119 to: India Application No. 202021053131, filed on Dec. 7, 2020. The entire contents of the aforementioned application are incorporated herein by reference.

TECHNICAL FIELD

The disclosure herein generally relates to the field of designing artificially structured materials and, more particularly, to a method and system for designing artificially structured materials, such as metamaterials, with customized functionalities.

BACKGROUND

Artificially structured materials such as metamaterials are materials whose fundamental structural unit (or unit cell) has dimensions on spatial scales corresponding to fractional orders of the interrogating wavelength(s) (or the wavelengths of interest) and exhibit behavior that is strongly influenced by its structure. Metamaterials are not found in nature, i.e., are created artificially and offer customizable properties (primarily electromagnetic or EM response). Optical metamaterials (MMs) are artificially structured composites that demonstrate customizable electromagnetic (EM) properties that stem from morphological feature dimensions of the order of the interrogating wavelength. MM devices are composed of periodic 2D or 3D arrays of subwavelength conducting elements and exhibit light-matter interactions that enable the manipulation of the effective electrical permittivity and effective magnetic permeability, therefore opening up new paths for versatile, photonic devices. Metamaterials have vast scope for a multitude of applications across domains as diverse as high-speed communications, photovoltaics, novel healthcare devices, stealth applications for defense amongst others, however, their technology penetration has been limited so far due to complex design processes that require advanced skills and knowledge base (s).

Traditionally, the artificially structured materials design process relies heavily on the knowledge and intuitive reasoning of a researcher as achieving a target spectral behavior involves iteratively tweaking the design till the outcome is satisfactory. Starting with an initial geometry, standard numerical techniques such as the finite-difference time domain method, boundary element method are employed for solving the Maxwell's equations for obtaining the spectral response. Of late, commercially available EM solver software packages have been widely adopted by the artificially structured materials community for designing metamaterials but there too, only a fraction of the parameter space can be explored with conventional computational hardware.

Currently, all available design tools (commercial software/open source tools) rely heavily on the intuition and knowledge base/domain awareness of the end user. This results in multiple, lengthy iterations to arrive at the design of choice.

SUMMARY

Embodiments of the present disclosure present technological improvements as solutions to one or more of the above-mentioned technical problems recognized by the inventors in conventional systems. For example, in one embodiment, a system for designing artificially structured materials is provided. The system comprises an input/output interface, one or more hardware processors, and a memory. The input/output interface configured to collate a set of requirements from a user based on an intended use case, wherein the set of requirements comprises one or more of a set of dimensional parameters, field profiles, or field resonances. The memory in communication with the one or more hardware processors, wherein the one or more first hardware processors are configured to execute programmed instructions stored in the memory, to: create a dataset corresponding to a structure of the artificially structured materials using the set of requirements; train a forward model using the dataset, wherein the set of dimensional parameters are provided as input and their corresponding desired electromagnetic response as output using a coupled artificial neural network and sequence model based architecture; save weights and biases for the forward model; fix the weights and the biases of a decoder part in an encoder-decoder tandem network from the saved weights and the biases of the forward model; train the encoder-decoder tandem network for an inverse problem using a single input multiple output model with the desired electromagnetic response as input and an output electromagnetic response at a time distributed layer of the encoder-decoder tandem network in the end and the dimension of artificially structured materials at a mid-dense layer of the encoder-decoder tandem network as output; save the weights and the biases of the encoder part from the trained encoder-decoder tandem network; fix the weights and the biases of the encoder from the saved weights and the biases of the trained encoder-decoder tandem network; provide the desired electromagnetic response as input to the trained encoder-decoder tandem network to obtain a final set of dimensions from the mid-dense layer of the encoder-decoder tandem network; and design the artificially structured material using the final set of dimensions.

In another aspect, a method for designing artificially structured materials is provided. Initially, a set of requirements re collated from a user based on an intended use case, wherein the set of requirements comprises one or more of a set of dimensional parameters, field profiles, or field resonances. Further, dataset corresponding to a structure of the artificially structured materials is created using the set of requirements. In the next step, a forward model is trained using the dataset, wherein the set of dimensional parameters are provided as input and their corresponding desired electromagnetic response as output using a coupled artificial neural network and sequence model based architecture. Weights and biases for the forward model is then saved. In the next step, the weights and the biases of a decoder part is fixed in an encoder-decoder tandem network from the saved weights and the biases of the forward model. Later, the encoder-decoder tandem network is trained for an inverse problem using a single input multiple output model with the desired electromagnetic response as input and an output electromagnetic response at a time distributed layer of the encoder-decoder tandem network in the end and the dimension of artificially structured materials at a mid-dense layer of the encoder-decoder tandem network as output. In the next step, the weights and the biases of the encoder part is saved from the trained encoder-decoder tandem network. Further, the desired electromagnetic response is provided as input to the trained encoder-decoder tandem network to obtain a final set of dimensions from the mid-dense layer of the encoder-decoder tandem network. And finally, the artificially structured material is designed using the final set of dimensions.

In yet another aspect, one or more non-transitory machine readable information storage mediums comprising one or more instructions which when executed by one or more hardware processors cause designing of artificially structured materials. Initially, a set of requirements re collated from a user based on an intended use case, wherein the set of requirements comprises one or more of a set of dimensional parameters, field profiles, or field resonances. Further, dataset corresponding to a structure of the artificially structured materials is created using the set of requirements. In the next step, a forward model is trained using the dataset, wherein the set of dimensional parameters are provided as input and their corresponding desired electromagnetic response as output using a coupled artificial neural network and sequence model based architecture. Weights and biases for the forward model is then saved. In the next step, the weights and the biases of a decoder part is fixed in an encoder-decoder tandem network from the saved weights and the biases of the forward model. Later, the encoder-decoder tandem network is trained for an inverse problem using a single input multiple output model with the desired electromagnetic response as input and an output electromagnetic response at a time distributed layer of the encoder-decoder tandem network in the end and the dimension of artificially structured materials at a mid-dense layer of the encoder-decoder tandem network as output. In the next step, the weights and the biases of the encoder part is saved from the trained encoder-decoder tandem network. Further, the desired electromagnetic response is provided as input to the trained encoder-decoder tandem network to obtain a final set of dimensions from the mid-dense layer of the encoder-decoder tandem network. And finally, the artificially structured material is designed using the final set of dimensions.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Figure 1:
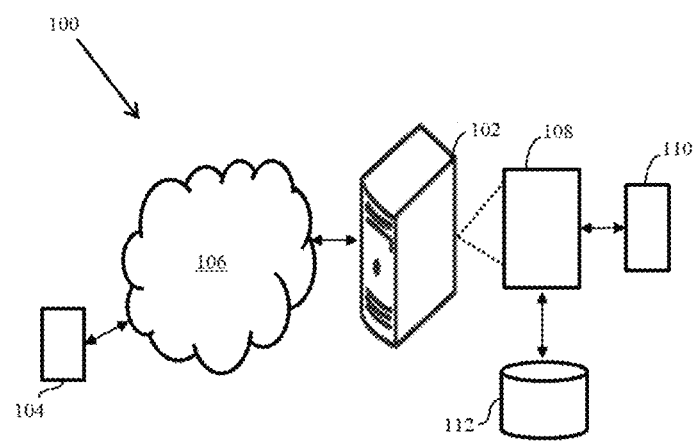
FIG. 1 illustrates a network diagram of a system for designing artificially structured materials according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

The existing methodologies for designing the artificially structured metamaterials employ complex numerical modeling tools (e.g. finite element). Further, the existing methodologies lack a suitable method to specify requirements in multiple formats (geometrical parameters, field profiles, field resonances etc.). There is also lack of ability to accept a manually defined spectrum from the user and seek a suitable structure for the electromagnetic response by using multiple libraries using techniques such as deep learning, machine learning etc. Further the existing design methodologies lack ability to scan multidimensional parameter spaces (feature geometries, EM field profiles, electric and magnetic field resonances) in order to provide an optimal solution.

According to an embodiment of the disclosure, a system 100 provides a technical solution to the above mentioned technical problems. The system is configured to design artificially structured materials with customized functionalities. The present disclosure provides an integrated and intelligent, data-driven framework for design, development and deployment of the artificially structured materials. Broadly, the present disclosure provides: (i) comprehensive design system and methodologies that help a user to rapidly converge on the right design for a desired application or functionality and (ii) Design system that does not require complex modeling techniques and advanced computational resources (high performance/exascale computing).

According to an embodiment of the disclosure, the system 100 is utilizing an approach based on neural networks for approximating the electromagnetic (EM) responses of artificially structured materials. In the present embodiment the artificially structured material is a mesoscale, split-ring resonator photonic metamaterials. Further, by treating the EM spectrum data as time varying sequences and the inverse problem as a single-input, multi-output (SIMO) model, architecture learns the geometry of the designs from the training data as opposed to abstract features thereby addressing both the forward and the inverse design problem with great promise. The method used in the present disclosure is faster and computationally less expensive than standard metamaterial simulations using first principles.

Referring now to the drawings, and more particularly to FIG. 1 through FIG. 7B, where similar reference characters denote corresponding features consistently throughout the figures, there are shown preferred embodiments and these embodiments are described in the context of the following exemplary system and/or method.

According to an embodiment of the disclosure, a network diagram of the system 100 for designing artificially structured materials with customized functionalities is shown in FIG. 1. It may be understood that the system 100 comprises one or more computing devices 102, such as a laptop computer, a desktop computer, a notebook, a workstation, a cloud-based computing environment and the like. It will be understood that the system 100 may be accessed through one or more input/output interfaces 104, collectively referred to as I/O interface 104 or user interface 104. Examples of the I/O interface 104 may include, but are not limited to, a user interface, a portable computer, a personal digital assistant, a handheld device, a smartphone, a tablet computer, a workstation and the like. The I/O interface 104 are communicatively coupled to the system 100 through a network 106.

In an embodiment, the network 106 may be a wireless or a wired network, or a combination thereof. In an example, the network 106 can be implemented as a computer network, as one of the different types of networks, such as virtual private network (VPN), intranet, local area network (LAN), wide area network (WAN), the internet, and such. The network 106 may either be a dedicated network or a shared network, which represents an association of the different types of networks that use a variety of protocols, for example, Hypertext Transfer Protocol (HTTP), Transmission Control Protocol/Internet Protocol (TCP/IP), and Wireless Application Protocol (WAP), to communicate with each other. Further, the network 106 may include a variety of network devices, including routers, bridges, servers, computing devices, storage devices. The network devices within the network 106 may interact with the system 100 through communication links.

The system 100 may be implemented in a workstation, a mainframe computer, a server, and a network server. In an embodiment, the computing device 102 further comprises one or more hardware processors 108, one or more memory 110, hereinafter referred as a memory 110 and a data repository 112, for example, a repository 112. The memory 110 is in communication with the one or more hardware processors 108, wherein the one or more hardware processors 108 are configured to execute programmed instructions stored in the memory 110, to perform various functions as explained in the later part of the disclosure. The repository 112 may store data processed, received, and generated by the system 100.

The system 100 supports various connectivity options such as BLUETOOTH®, USB, ZigBee and other cellular services. The network environment enables connection of various components of the system 100 using any communication link including Internet, WAN, MAN, and so on. In an exemplary embodiment, the system 100 is implemented to operate as a stand-alone device. In another embodiment, the system 100 may be implemented to work as a loosely coupled device to a smart computing environment. The components and functionalities of the system 100 are described further in detail.

The system 100 is configured to provide end-to-end workflow from collating the requirement specifications from the user (based on the intended use case such as solar energy harvesting, biological sensing, thermos-photovoltaics, photo-detection, creation of imaging devices, absorption filtering and stealth technology) to generating a device design for the intended functionality with visualization of the resulting solution space.

According to an embodiment of the disclosure the system 100 comprises two aspects: a forward problem (predicting the electromagnetic response for a given geometry) as well as an inverse problem (generating the structural parameters for a desired electromagnetic response). The workflow of the present methodology for designing the artificially structured materials is divided into two: First, the training of a forward model with the geometry as input and the corresponding spectrum as output, and second, posing the training approach for the inverse problem as a single-input, multi-output (SIMO) model using a tandem network of an encoder and a decoder with sequential input data (spectral information in this case). The dimensions and the spectra are outputs of the trained inverse model. The combined loss is controlled by fixing the weights and biases of decoder with the pre-trained forward multi-layer perceptron-long short term memory (MLP-LSTM) network (dimensions-sequence).

Figure 2A:
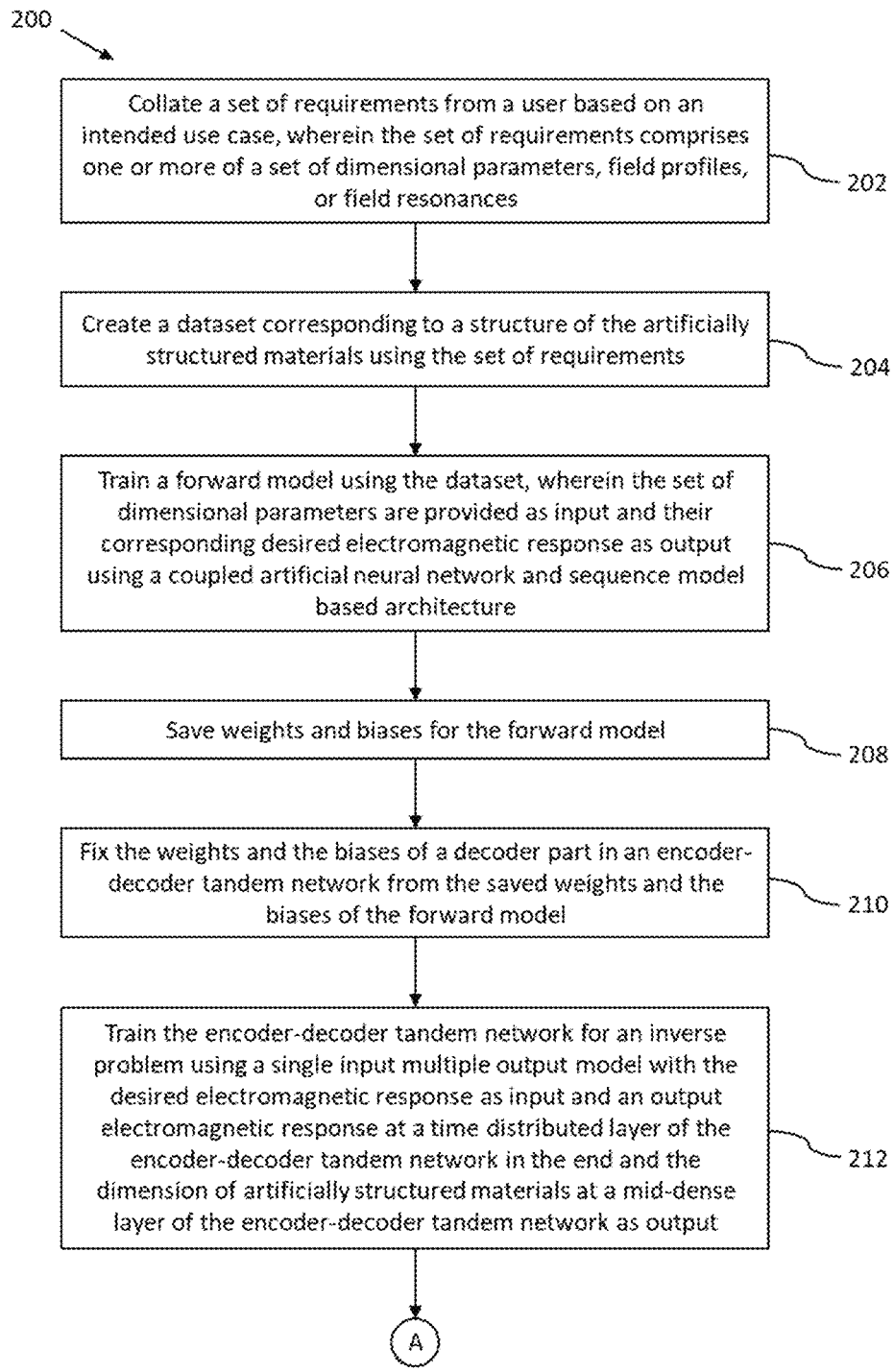
FIG. 2A-2B is a flow diagram illustrating a method for designing artificially structured materials in accordance with some embodiments of the present disclosure.
Figure 2B:
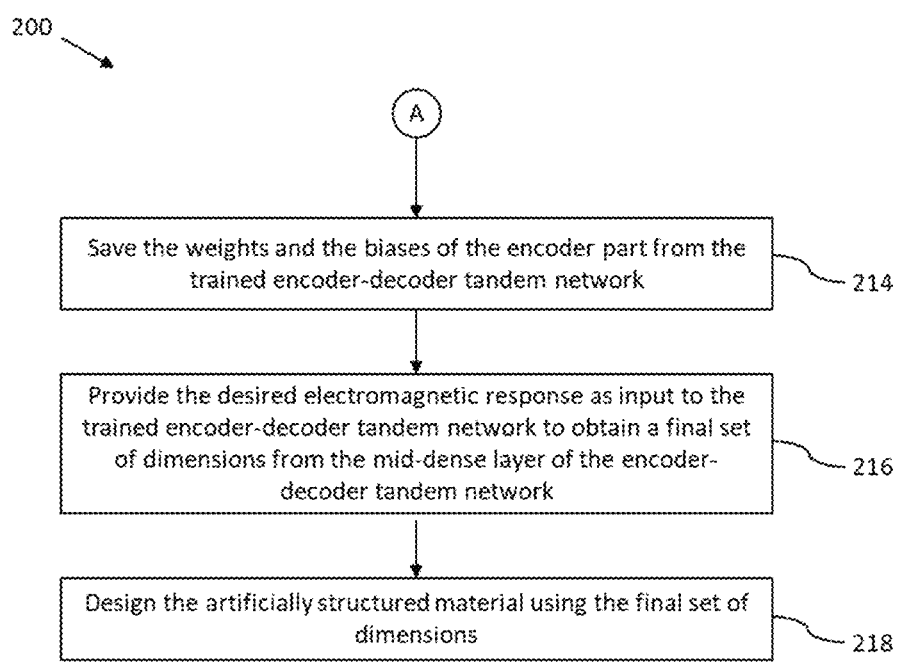

In operation, a flow diagram of a method 200 for designing artificially structured materials with customized functionalities, according to some embodiments of the present disclosure is shown in FIG. 2A-2B. The method 200 depicted in the flow chart may be executed by a system, for example, the system, 100 of FIG. 1. In an example embodiment, the system 100 may be embodied in a computing device.

Operations of the flowchart, and combinations of operation in the flowchart, may be implemented by various means, such as hardware, firmware, processor, circuitry and/or other device associated with execution of software including one or more computer program instructions. For example, one or more of the procedures described in various embodiments may be embodied by computer program instructions. In an example embodiment, the computer program instructions, which embody the procedures, described in various embodiments may be stored by at least one memory device of a system and executed by at least one processor in the system. Any such computer program instructions may be loaded onto a computer or other programmable system (for example, hardware) to produce a machine, such that the resulting computer or other programmable system embody means for implementing the operations specified in the flowchart. It will be noted herein that the operations of the method 200 are described with help of system 100. However, the operations of the method 200 can be described and/or practiced by using any other system.

Initially at step 202, the method 200 includes collating a set of requirements from the user. The set of requirements comprises a set of dimensional parameters, field profiles, field resonances etc. The set of requirements are collated based on the intended use case such as solar energy harvesting, biological sensing, thermos-photovoltaics, photo-detection, creation of imaging devices, absorption filtering and stealth technology.

At step 204, the method 200 includes creating a dataset using the set of requirements and a set of dimensional parameters. The dataset consisting of the set of dimensional parameters and corresponding electromagnetic response by solving Maxwell's equation using first principles with help of a numerical simulation package. The dataset is stored in the data repository 112. The set of dimensional parameters may also be referred to as the geometry of the artificially structured materials. In an example, the set of dimensional parameters comprises a length, a width, a thickness of a substrate and a width of a capacitor of the artificially structured materials. The set of dimensional parameters may also include any other parameters which is required for designing the artificially structured materials. The structure of the artificially structured material is one or more of a 3 dimensional or 2 dimensional structure.

At step 206, the method 200 includes training a forward model with the set of dimensional parameters as input and their corresponding desired electromagnetic response as output using a coupled artificial neural network and a sequence model, based architecture. The sequence model may be one of a recurrent neural network, a long-short term memory (LSTM) network, transformer, gated recurrent unit (GRU) based recurrent neural networks, any network which can deal with sequence data. In an example long-short term memory network is used as sequence model. In an example, Tan h activation function was used in LSTM layer. Kernel and bias regularization is used for preventing overfitting. ReLu activation function is used throughout dense layers to obtain the value between 0 and 1 in the hidden layers. Time distributed layer is used for wrapping the output of LSTM layers.

Figure 3:
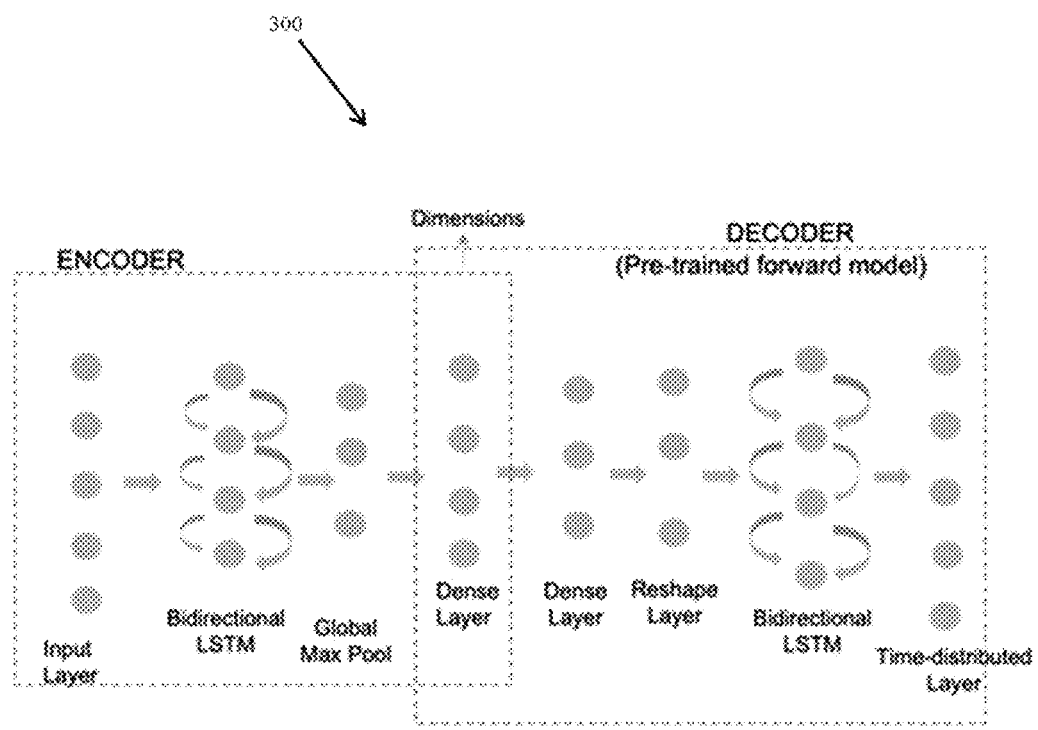
FIG. 3 shows an encoder-decoder tandem network used in the system of FIG. 1 in accordance with some embodiments of the present disclosure.

At step 208, the method 200 includes saving weights and biases for the forward model. At step 210, the method 200 includes fixing the weights and the biases of a decoder part in an encoder-decoder tandem network 300 or architecture from the saved weights and the biases of the forward model as shown in FIG. 3.

At step 212, the method includes training the encoder-decoder tandem network 300 for an inverse problem using a single input multiple output (SIMO) model with the desired electromagnetic response as input and an output electromagnetic response at a time distributed layer of the encoder-decoder tandem network 300 in the end and the dimension of artificially structured materials at a mid-dense layer of the encoder-decoder tandem network 300 as output.

At step 214, the method 200 includes saving the weights and the biases of the encoder part from the trained encoder-decoder tandem network 300.

At step 216, the method 200 includes providing the desired electromagnetic response as input to the trained encoder-decoder tandem network 300 to obtain a final set of dimensions from the mid-dense layer of the encoder-decoder tandem network 300.

And finally at step 218, the method 200 includes designing the artificially structured material using the final set of dimensions.

According to an embodiment of the present disclosure, the system 100 is also configured to visualize the designed artificially structured materials on a visualization tool for performing analysis.

According to an embodiment of the disclosure, the system 100 is further configured to pre-process the dataset prepared at step 202 of the method 200 to remove undesired dimensional parameters out of the set of dimensional parameters.

Figure 4:
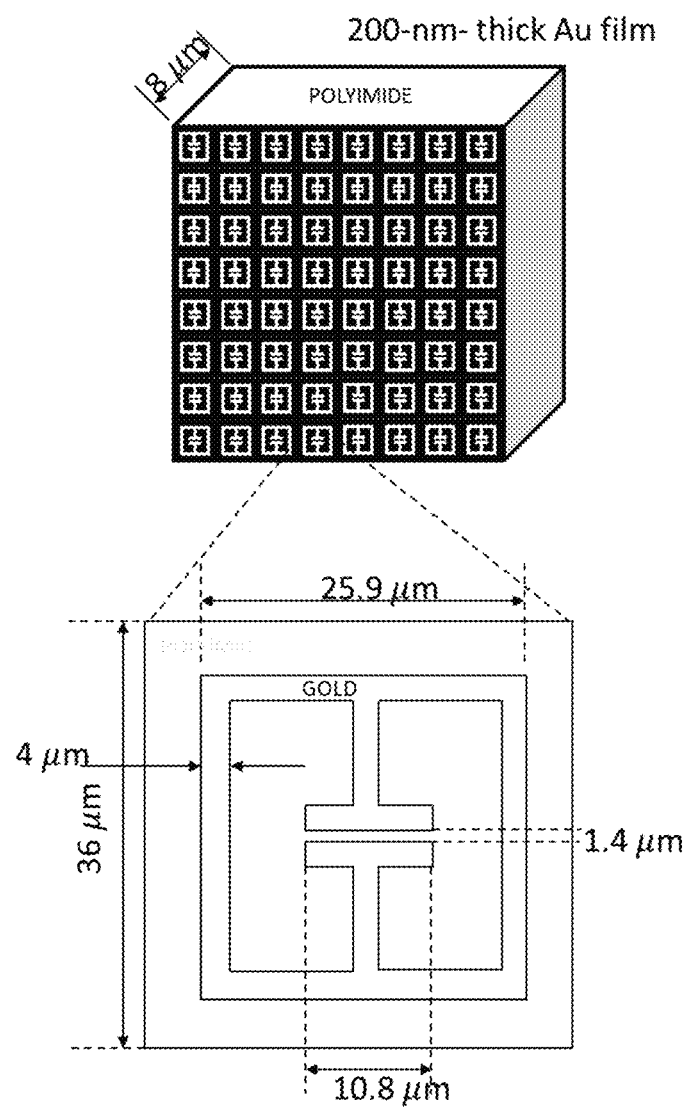
FIG. 4 shows Annotated schematic of the chosen split-ring resonator metamaterial in accordance with some embodiments of the present disclosure.

According to an embodiment of the disclosure, the system 100 can also be explained with the help of a metamaterial (MM) device based on split-ring resonators (SRRs). The SRR has been designed for near-unity absorption (97%) at 1.6 terahertz (THz). The split-ring resonators (SRRs) are a MM design element type that demonstrates negative permeability and supports inductive-capacitive (LC) resonances. FIG. 4 depicts a schematic of the SRR along with its dimensions. A magnetic flux penetrating the metal rings will induce rotating currents in the rings, which produce their own flux to enhance or oppose the incident field. Negative permeability is obtained using periodic array of split ring resonators. These property alters the way electromagnetic waves interact with the material obtaining absorption spectrum completely different from ordinary materials.

The method started by building the dataset. The dataset is comprising of 5169 geometries and their corresponding spectral response calculated by solving for Maxwell's equation using first principles with the help of a numerical simulation package such as COMSOL 5.3. Split ring resonator physics was learnt for applying the boundary conditions and material properties and electromagnetic wave simulation. The geometries were generated by performing parametric sweeps over its defining geometrical parameters namely, the linewidth of the gold features (w), the thickness of the dielectric substrate (t), the length of the gold layer (I) and the width of the split region's (capacitor) region (c). The corresponding absorption curves were plotted between 0.8 THz to 2.4 THz and discretized into 161 data points. Further data pre-processing is done to get the absorption simulation and the non-absorption simulation. The dataset was split into three parts, namely, the training set, the validation set and the test set in the ratio 70:15:15 respectively.

The forward model in this case, is a combination of a multilayer perceptron (MLP) and a bidirectional long short-term memory (LSTM) layer wherein the inputs comprise of 16 expanded dimensions obtained by combining the four geometrical parameters (I, t, w, c) using ratios and products. The 161-dimensional output was treated as time steps for the sequential input to the bidirectional LSTM layer and the output is then obtained through a time-distributed wrapper on the final feed-forward layer with a linear activation function. As multiple geometries can yield near-identical EM responses, L2 regularization was done for all layers to make more generalized and robust model which can discriminate between geometries having near identical spectra. The regularization parameter and the learning rate was set at 0.00001 and 0.0001 respectively. The architecture is trained for 1000 epochs and the mean squared error (MSE) was selected as the loss function.

Figure 5A:
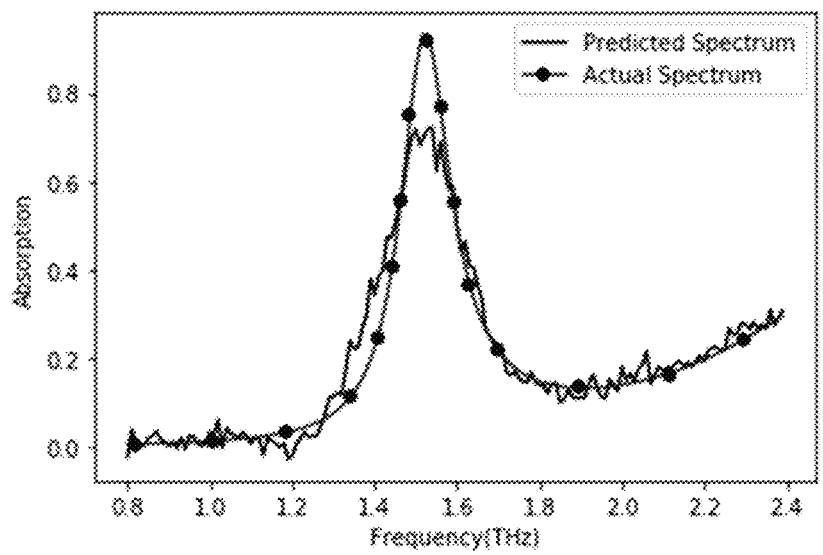
FIG. 5A and FIG. 5B show graphical illustration of performance comparison of a DNN-only and an LSTM-based forward model on randomly selected samples from test set respectively in accordance with some embodiments of the present disclosure.
Figure 5B:
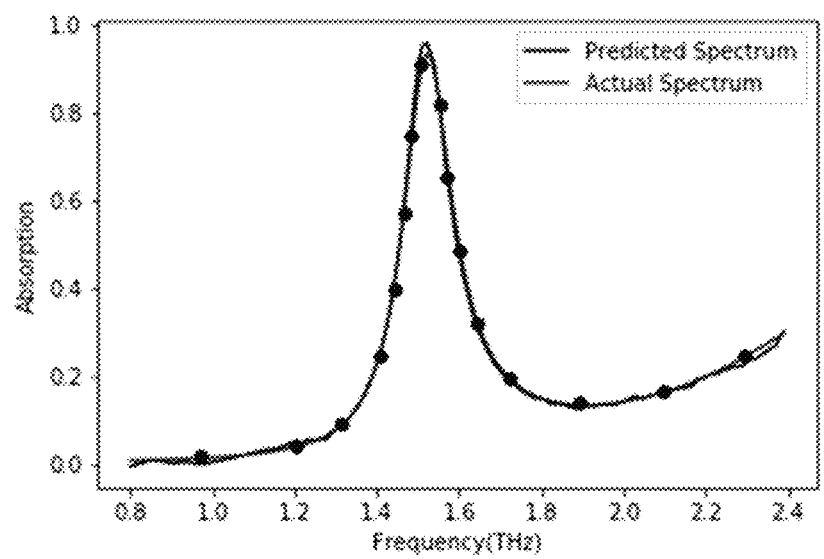

In order to validate the hypothesis provided in the present disclosure, i.e., of treating the spectral response as sequence of absorption values, the model's predictions were compared to an architecture without an LSTM and using a feed forward non-recurrent neural network. FIG. 5A and FIG. 5B depicts the superiority of the LSTM-based forward network in predicting the spectral response. Therefore, for the inverse model as well, the LSTM layer is a fitting choice considering the sequential nature of the input spectral data.

Once successfully trained, the forward model was connected to the inverse model to form a tandem neural network consisting of an encoder and a decoder, wherein the decoder has the weights saved from the pre-trained forward model. The encoder input is the sequence of 161 absorption values, which are encoded to the geometry's dimensions using a combination of the LSTM layer and a MLP encompassing the architecture for the inverse predictions. Within the encoder, the MLP transforms the LSTM output features averaged over the time steps into the dimensions (geometry). The decoder, then takes these dimensions and outputs the spectral response using the pre-trained network weights.

During training, the tandem network, learns to yield the dimensional information for the SRR structures while trying to reproduce the spectral input given. The loss function is selected as MSE for both the outputs and trained for 1000 epochs. The training approach for the tandem network is similar to auto-encoder architectures used for dimensionality reduction and learning latent representations of data in an unsupervised manner. However, here, the network is forced to learn the geometry of the MM device rather than abstract features, thus solving the inverse problem with great promise.

Figure 6A:
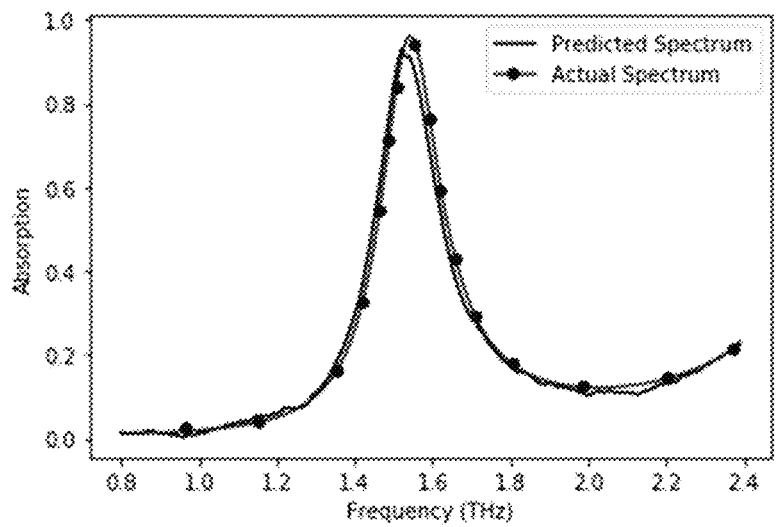
FIGS. 6A and 6B show graphical illustration of comparison of predicted and actual spectra from the tandem model on randomly selected samples from test set in accordance with some embodiments of the present disclosure.
Figure 6B:
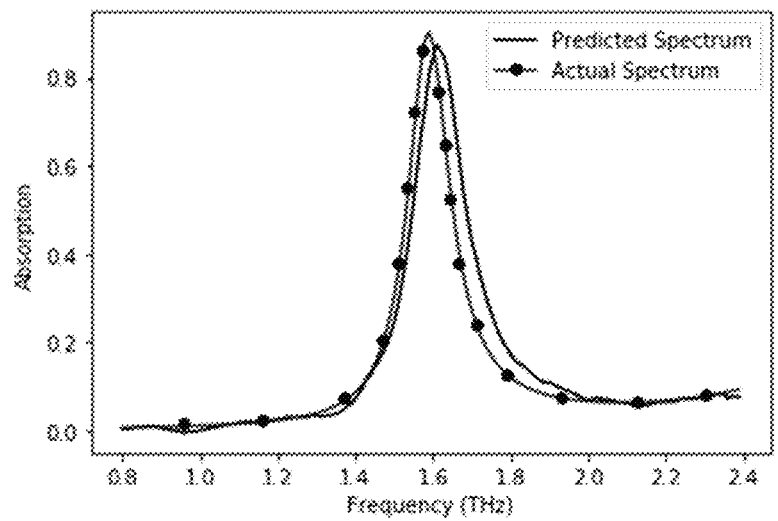
Figure 7A:
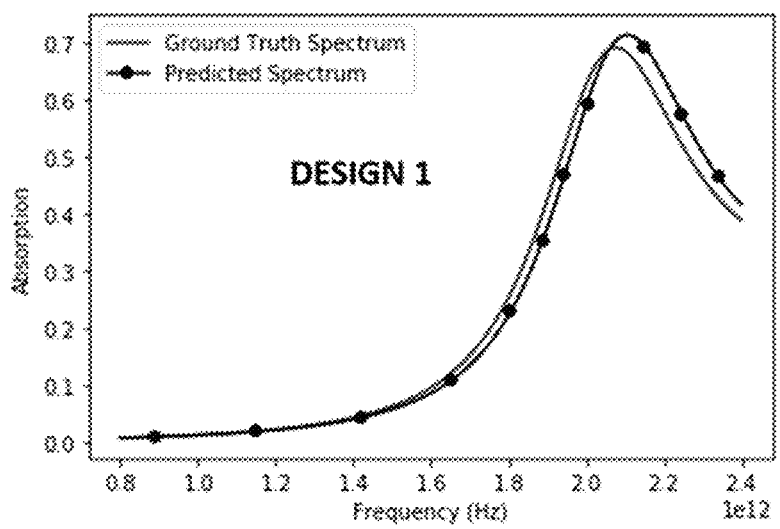
FIGS. 7A and 7B show graphical illustration of comparison of predicted and actual spectra from the forward model on randomly selected samples from test set in accordance with some embodiments of the present disclosure.
Figure 7B:
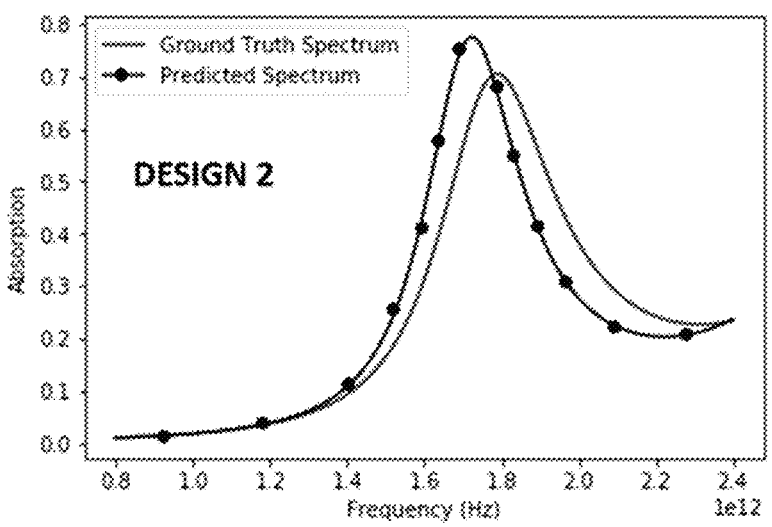

Table 1 summarizes the average losses obtained for the forward and the tandem inverse models over 5 runs. In order to evaluate the capability of the tandem model to retain information about the input spectra, a few geometries were randomly selected and compared the ground truth spectra to their corresponding spectra as predicted, from the test set. As shown in FIG. 6A and FIG. 6B, the predictions from the tandem model closely follows the actual curves, thereby validating the approach of the present disclosure. As a performance test for the inverse model, a random selection were again done of a few predicted SRR geometries, computed their EM response using the full-wave EM solver, and compared them to the test set spectra from the inverse model as shown in FIG. 7A and FIG. 7B. The results (Table 2) show that the SIMO approach is able to converge on a design solution without significant deviations.

TABLE 1

Model evaluation (Average losses over 5 runs)

| Model | Train | Validation | Test |
| --- | --- | --- | --- |
| Forward model | 0.0056 | 0.0057 | 0.0056 |
| Inverse model (spectrum) | 0.004 | 0.0039 | 0.004 |
| Inverse model (dimension) | 48.64 | 59.79 | 53.38 |

TABLE 2

Predicted vs actual values of design parameters of the SRR. All values are in micrometers. D1 and D2 are randomly selected geometries from the test set

| | D1 | | | | D2 | | | |
| --- | --- | --- | --- | --- | --- | --- | --- | --- |
| | l | w | t | c | l | w | t | c |
| Ground truth | 23.95 | 4.96 | 9.43 | 10.52 | 27.49 | 5.50 | 8.31 | 10.69 |
| Predicted | 23.90 | 4.75 | 9.00 | 11.50 | 27.90 | 5.25 | 8.10 | 10.60 |

The embodiments of present disclosure herein addresses unresolved problem of lengthy and time taking process of designing the artificially structured materials. The embodiment, thus provides a method and system for designing artificially structured materials with customized functionalities. The method is faster and computationally less expensive than standard metamaterial simulations used in the prior art.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for designing artificially structured materials, the method comprising:
   receiving, via one or more hardware processors, a set of requirements from a user based on an use case, wherein the set of requirements comprises one or more of a set of dimensional parameters, field profiles, or field resonances, wherein the set of dimension parameters refers to geometries of the artificially structured materials;
   creating, via one or more hardware processors, a dataset corresponding to a structure of the artificially structured materials using the set of requirements;
   training, via the one or more hardware processors, a forward model using the dataset, wherein the set of dimensional parameters are provided as input and predicting their corresponding electromagnetic response as output using a coupled artificial neural network and sequence model based architecture, wherein the network is forced to learn the geometries of meta materials devices;
   treating EM spectrum data as a time varying sequence and inverse problem as a single-input, multi-output (SIMO) model, wherein the coupled artificial neural network and sequence model based architecture learns geometry of designs from the trained forward model;
   saving, via the one or more hardware processors, weights and biases for the forward model;
   fixing, via the one or more hardware processors, the weights and the biases of a decoder part in an encoder-decoder tandem network from the saved weights and the biases of the forward model to control a combined loss;
   training, via the one or more hardware processors, the encoder-decoder tandem network for an inverse problem using a single input multiple output model with the electromagnetic response as input and an output electromagnetic response at a time distributed layer of the encoder-decoder tandem network in the end and the dimension of artificially structured materials at a mid-dense layer of the encoder-decoder tandem network as output;
   saving, via the one or more hardware processors, the weights and the biases of the encoder part from the trained encoder-decoder tandem network;
   providing, via the one or more hardware processors, the electromagnetic response as input to the trained encoder-decoder tandem network to obtain a final set of dimensions from the mid-dense layer of the encoder-decoder tandem network; and designing, via the one or more hardware processors, the artificially structured material using the final set of dimensions.

2. The processor implemented method according to claim 1 further comprising visualizing the designed artificially structured material on a visualization tool for performing analysis.

3. The processor-implemented method according to claim 1, wherein the set of dimensional parameters comprises a length, a width, a thickness of a substrate, and a width of a capacitor of the artificially structured materials.

4. The processor-implemented method according to claim 1, wherein the dataset comprising of a set of geometrical parameters and corresponding electromagnetic response by solving Maxwell's equation using first principles with help of a numerical simulation package.

5. The processor-implemented method according to claim 1, wherein the sequence model is one of a recurrent neural network, a long short term memory (LSTM) network, or a transformer, gated recurrent unit (GRU) based recurrent neural networks.

6. The processor method according to claim 1 wherein the artificially structured material is a split ring resonator (SRR) metamaterial.

7. The processor implemented method according to claim 1 further comprising pre-processing the dataset to remove undesired dimensional parameters out of the set of dimensional parameters.

8. The processor implemented method according to claim 1, wherein the structure of the artificially structured material is one or more of a 3 dimensional or 2 dimensional structure.

9. A system for designing artificially structured materials, the system comprises:
an input/output interface configured to receive a set of requirements from a user based on an use case, wherein the set of requirements comprises one or more of a set of dimensional parameters, field profiles, or field resonances, wherein the set of dimension parameters refers to geometries of the artificially structured materials;
one or more hardware processors; and
a memory in communication with the one or more hardware processors, wherein the one or more first hardware processors are configured to execute programmed instructions stored in the memory, to
create a dataset corresponding to a structure of the artificially structured materials using the set of requirements;
train a forward model using the dataset, wherein the set of dimensional parameters are provided as input and predicting their corresponding electromagnetic response as output using a coupled artificial neural network and sequence model based architecture, wherein the network is forced to learn the geometries of the meta materials devices;
treat EM spectrum data as a time varying sequence and inverse problem as a single-input, multi-output (SIMO) model, wherein the coupled artificial neural network and sequence model based architecture learns geometry of designs from the trained forward model;
save weights and biases for the forward model;
fix the weights and the biases of a decoder part in an encoder-decoder tandem network from the saved weights and the biases of the forward model to control a combined loss;
train the encoder-decoder tandem network for an inverse problem using a single input multiple output model with the electromagnetic response as input and an output electromagnetic response at a time distributed layer of the encoder-decoder tandem network in the end and the dimension of artificially structured materials at a mid-dense layer of the encoder-decoder tandem network as output;
save the weights and the biases of the encoder part from the trained encoder-decoder tandem network;
fix the weights and the biases of the encoder from the saved weights and the biases of the trained encoder-decoder tandem network;
provide the electromagnetic response as input to the trained encoder-decoder tandem network to obtain a final set of dimensions from the mid-dense layer of the encoder-decoder tandem network; and
design the artificially structured material using the final set of dimensions.

10. The system according to claim 9, wherein the set of dimensional parameters comprises a length, a width, a thickness of a substrate and a width of a capacitor of the artificially structured materials.

11. The system according to claim 9, wherein the structure of the artificially structured material is one or more of a 3 dimensional or 2 dimensional structure.

12. The system according to claim 9, wherein the artificially structured material is a split ring resonator (SRR) metamaterial.

13. One or more non-transitory machine readable information storage mediums comprising one or more instructions which when executed by one or more hardware processors cause managing a plurality of events, the instructions cause:
receiving a set of requirements from a user based on an use case, wherein the set of requirements comprises one or more of a set of dimensional parameters, field profiles, or field resonances, wherein the set of dimension parameters refers to geometries of the artificially structured materials;
creating a dataset corresponding to a structure of the artificially structured materials using the set of requirements;
training a forward model using the dataset, wherein the set of dimensional parameters are provided as input and predicting their corresponding electromagnetic response as output using a coupled artificial neural network and sequence model based architecture, wherein the network is forced to learn the geometries of meta materials devices;
treating EM spectrum data as a time varying sequence and inverse problem as a single-input, multi-output (SIMO) model, wherein the coupled artificial neural network and sequence model based architecture learns geometry of designs from the trained forward model;
saving weights and biases for the forward model;
fixing the weights and the biases of a decoder part in an encoder-decoder tandem network from the saved weights and the biases of the forward model;
training the encoder-decoder tandem network for an inverse problem using a single input multiple output model with the electromagnetic response as input and an output electromagnetic response at a time distributed layer of the encoder-decoder tandem network in the end and the dimension of artificially structured materials at a mid-dense layer of the encoder-decoder tandem network as output;

saving the weights and the biases of the encoder part from the trained encoder-decoder tandem network;

providing the electromagnetic response as input to the trained encoder-decoder tandem network to obtain a final set of dimensions from the mid-dense layer of the encoder-decoder tandem network; and designing, via the one or more hardware processors, the artificially structured material using the final set of dimensions.

* * * * *